(12) United States Patent
Fuchigami

(10) Patent No.: US 9,041,113 B2
(45) Date of Patent: May 26, 2015

(54) SEMICONDUCTOR INTEGRATED DEVICE

(71) Applicant: LAPIS SEMICONDUCTOR CO., LTD., Tokyo (JP)

(72) Inventor: Chikashi Fuchigami, Tokyo (JP)

(73) Assignee: LAPIS Semiconductor Co., Ltd., Tokyo (JP)

( * ) Notice: Subject to any disclaimer, the term of this patent is extended or adjusted under 35 U.S.C. 154(b) by 72 days.

(21) Appl. No.: 13/777,951

(22) Filed: Feb. 26, 2013

(65) Prior Publication Data

US 2013/0234251 A1 Sep. 12, 2013

(30) Foreign Application Priority Data

Mar. 6, 2012 (JP) ................. 2012-048870

(51) Int. Cl.
*H01L 27/02* (2006.01)
*H01L 29/78* (2006.01)
*H01L 23/31* (2006.01)
*H01L 23/00* (2006.01)

(52) U.S. Cl.
CPC ............... *H01L 27/027* (2013.01); *H01L 29/78* (2013.01); *H01L 23/3157* (2013.01); *H01L 24/10* (2013.01); *H01L 2924/13091* (2013.01)

(58) Field of Classification Search
CPC ............ H01L 27/0251; H01L 27/0266; H01L 27/027
USPC ........................................ 257/360, 516
See application file for complete search history.

(56) References Cited

U.S. PATENT DOCUMENTS

2010/0237386 A1* 9/2010 Lin et al. .................... 257/173
2012/0061795 A1* 3/2012 Yen et al. .................... 257/516

FOREIGN PATENT DOCUMENTS

JP 2008-135486 A 6/2008

* cited by examiner

*Primary Examiner* — Matthew W Such
*Assistant Examiner* — Warren H Kilpatrick
(74) *Attorney, Agent, or Firm* — Studebaker & Brackett PC

(57) ABSTRACT

A semiconductor integrated device in which electrostatic discharge damage can be reliably prevented, includes a semiconductor substrate in which an electrostatic protection circuit including a second diffusion region surrounding a first diffusion region as a local region is formed in a main surface; a metal pad opposed to the main surface; and a conductive bump formed so as to face a top surface of the metal pad, wherein in a surface opposed to the metal pad of the conductive bump, a projection which is in contact with the metal pad is provided in a range opposed to the first diffusion region.

16 Claims, 7 Drawing Sheets

W - W SECTION

SEMICONDUCTOR INTEGRATED DEVICE

BACKGROUND OF THE INVENTION

1. Technical Field

The present invention relates to a semiconductor chip and, more particularly, to a semiconductor integrated device wherein a bump for connection to the outside is formed on its surface.

2. Background Art

At present, flip chip mounting (hereinbelow, referred to as FC mounting) is known as a method of directly mounting a semiconductor chip such as an IC (Integrated Circuit) or an LSI (Large Scale Integration) on a substrate. There is also known a semiconductor chip used in the FC mounting, having a surface on which an electrode pad as an external terminal is formed and a bump electrode for connection to the outside is formed on the surface of the electrode pad (refer to, for example, FIG. 3B of Japanese Patent Application Laid-Open No. 2008-135486).

To prevent ESD (electrostatic discharge) damage due to ESD (electrostatic discharge), the semiconductor chip is provided with an electrostatic protection circuit which is, for example, a diode device near the electrode pad.

However, when a surge voltage due to electrostatic discharge is applied to the bump electrode, a case can arise where a voltage is applied simultaneously to both an anode electrode and a cathode electrode of the diode device. Since no current flows in the electrostatic protection circuit in this case, the inherent operation of the electrostatic protection circuit for preventing an electrostatic discharge damage by allowing a current to pass is not performed, and there is a possibility that the electrostatic protection circuit itself is damaged.

SUMMARY OF THE INVENTION

An object of the present invention is to provide a semiconductor integrated device that can reliably prevent ESD damage.

A semiconductor integrated device according to an aspect of the present invention includes: a semiconductor substrate in which an electrostatic protection circuit is formed in a main surface; a metal pad whose undersurface is opposed to the main surface; and a conductive bump formed so as to be opposed to a top surface of the metal pad. The electrostatic protection circuit includes a first diffusion region and a second diffusion region which are adjacent to each other, the first diffusion region is surrounded by the second diffusion region and, in a face opposed to the metal pad of the conductive bump, a projection which is in contact with the metal pad is provided in a range opposed to the first diffusion region.

In the configuration, in the surface opposed to the metal pad of the conductive bump, a projection is provided, the projection being in contact with the metal pad only in a range opposed to the first diffusion. In the configuration, when a surge voltage due to electrostatic discharge is applied to the conductive bump, the surge voltage is applied directly to the first diffusion region of the electrostatic protection circuit via the metal pad and is applied also to the second diffusion region via parasitic capacitance which exists between a power supply line (or ground line) formed on the main surface of the semiconductor substrate and conductive bump. Since the conductive bump and the metal pad are apart from each other above the second diffusion region, the parasitic capacitance is combined capacitance of serial connection of first parasitic capacitance between the power supply line (or ground line) and the metal pad and second parasitic capacitance between the metal pad and the conductive bump. Therefore, the combined capacitance becomes lower than the first parasitic capacitance, so that the surge voltage applied to the second diffusion region via the parasitic capacitance decreases as compared with the case of the first parasitic capacitance only.

Accordingly, the potential difference occurs between the first and second diffusion regions of the electrostatic protection circuit. Consequently, even when the surge voltage is applied simultaneously to the first and second diffusion regions, the electrostatic protection circuit can consume current due to the electrostatic discharge by passing the current to the power supply line (or ground line).

Therefore, according to the present invention, an electrostatic discharge damage on the internal circuit of the semiconductor chip can be reliably prevented without causing a damage of the electrostatic protection circuit itself.

DETAILED DESCRIPTION OF THE EMBODIMENTS

Figure 1:
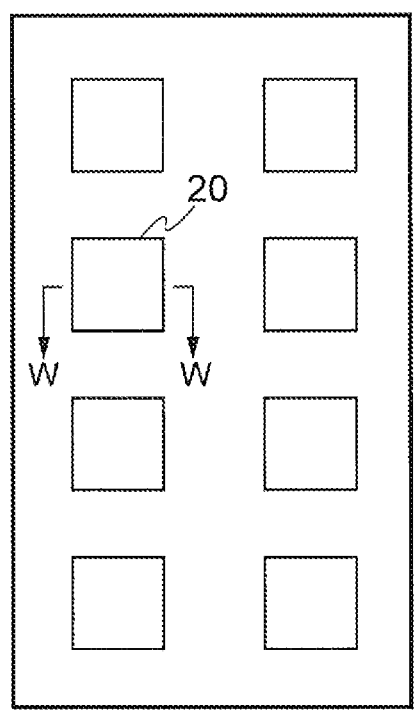
FIG. 1 is a top view illustrating a top face of a semiconductor chip 1 as a semiconductor integrated device.

A semiconductor integrated device of the embodiments includes a semiconductor substrate (10) in which an electrostatic protection circuit (HCa, HCb) including a second diffusion region (13, 15, 53, 54, 63, 64) surrounding a first diffusion region (12, 14, 52, 62) is formed in a main surface; a metal pad (21) opposed to the main surface; and a conductive bump (20) opposed to a top surface of the metal pad and, in a face opposed to the metal pad of the conductive bump, a projection (2a, 2b) which is in contact with the metal pad is provided in a range opposed to the first diffusion region.

Embodiments

FIG. 1 is a top view illustrating the top face of a semiconductor chip 1 as a semiconductor integrated device.

As illustrated in FIG. 1, a plurality of conductive bumps 20 as external terminals are formed on the surface of the semiconductor chip 1.

Figure 2A:
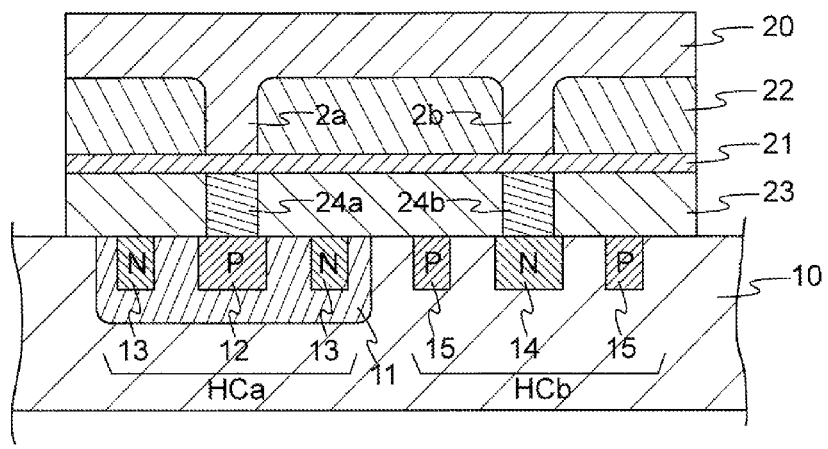
FIGS. 2A and 2B are diagrams illustrating the structure of the semiconductor chip 1.
Figure 2B:
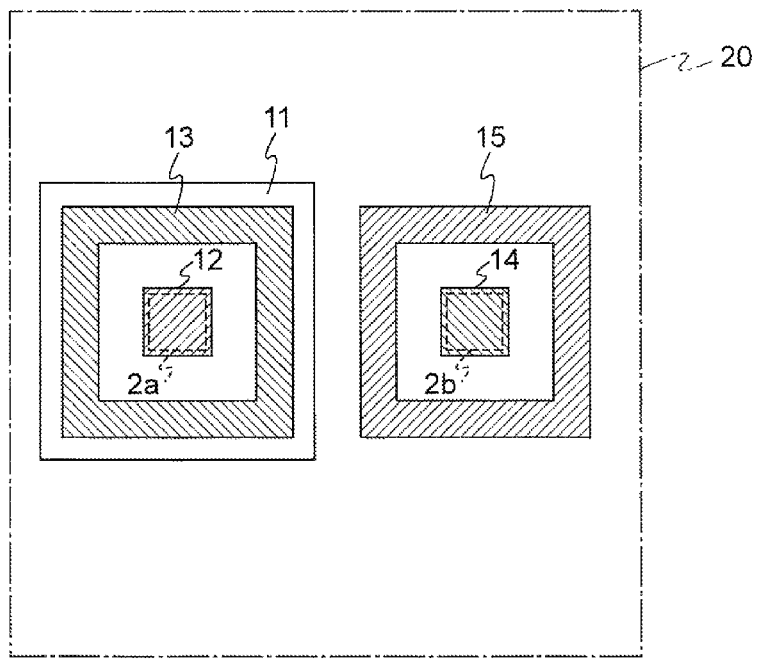

FIG. 2A is a cross section illustrating a section of the semiconductor chip 1 taken along line W-W of FIG. 1. FIG. 2B is a diagram illustrating the structure of a region corresponding to the bump 20 in the surface of the semiconductor chip 1.

The bump 20 is a conductive plate-shaped electrode made of solder, gold (Au), or the like, and its top face (face exposed to the outside) is a bonding surface which is bonded to a terminal of a mounting substrate or another chip. On the undersurface of the bump 20, projections 2a and 2b as illustrated in FIGS. 2A and 2B are formed, and apex faces of the projections 2a and 2b are in contact with a plate-shaped metal pad 21. Between the bumps 20 and the metal pad 21, a passivation film 22 made of an insulating material such as an oxide film, a nitride film, or polyimide is formed. Specifically, each of the projections 2a and 2b penetrates the passivation film 22 and is in contact with one of the faces of the metal pad 21. That is, the passivation film 22 as an insulating film is formed between the region except for the above-described projections 2a and 2b in the surface opposed to the metal pad 21, of the bump 20 and the metal pad 21. An insulating film 23 made of silica dioxide or the like is formed between the other surface of the metal pad 21 and the surface of the semiconductor chip 1. Through holes are formed in positions corresponding to the projections 2a and 2b respectively in the insulating layer 23. In the through holes, conductive members 24a and 24b electrically connecting the metal pad 21 and the surface of the semiconductor chip 1 are filled or inserted.

In a region just below the bump 20 in/around the surface (hereinbelow, referred to as main surface) of the semiconductor chip 1, electrostatic protection circuits HCa and HCb for preventing an electrostatic discharge damage due to electrostatic discharge are formed.

The electrostatic protection circuit HCa includes an n-well region 11 formed in the main surface of a semiconductor substrate 10 of the p-channel type, a diffusion region 12 of the p-channel type, and a diffusion region 13 of the n-channel type which are formed in the n-well region 11. The diffusion region 12 is formed in a position just below the apex face of the projection 2a of the bump 20, and its top face is in contact with the conductive member 24a. The top face region of the diffusion region 12 is slightly larger than the size of the apex face of the projection 2a as illustrated by the broken line in FIG. 2B. Specifically, the size of the top face region of the diffusion region 12 and the size of the apex face of the projection 2a are set so that the apex face of the projection 2a is included in the top face region of the diffusion region 12, as illustrated by the broken line in FIG. 2B, when the apex face of the projection 2a and the top face region of the diffusion region 12 are seen from the top face side of the bump 20 just below. The diffusion region 13 is formed in the main surface of the n-well region 11 so as to annularly surround the diffusion region 12 as illustrated in FIG. 2B. The diffusion region 13 is connected to a power supply line (not illustrated) formed in the main surface of the semiconductor substrate 10.

Figure 3:
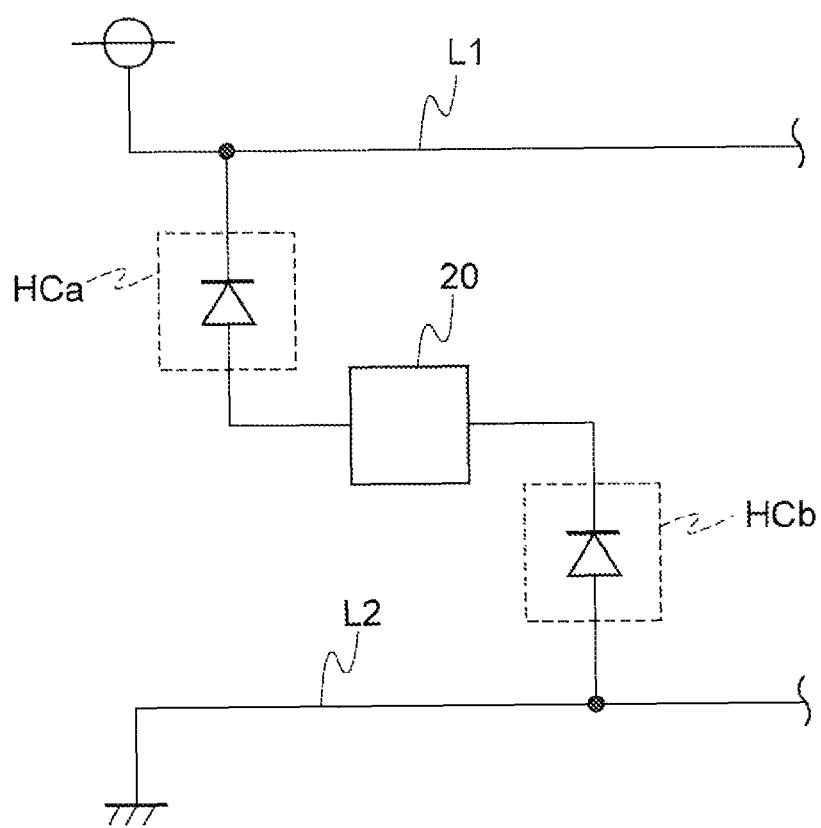
FIG. 3 is a circuit diagram illustrating an equivalent circuit of electrostatic protection circuits HCa and HCb illustrated in FIGS. 2A and 2B.

As illustrated in FIG. 3, specifically, the electrostatic protection circuit HCa is a diode device whose anode terminal is connected to the bump 20 and whose cathode terminal is connected to a power supply line L1 for supplying power supply voltage.

The electrostatic protection circuit HCb includes a diffusion region 14 of the n-channel type and a diffusion region 15 of the p-channel type, which are formed in the main surface of the semiconductor substrate 10 of the p-channel type. The diffusion region 14 is formed in a position just below the apex face of the projection 2b of the bump 20, and its top face is in contact with the conductive member 24b. The top face region of the diffusion region 14 is slightly larger than the size of the apex face of the projection 2b, as illustrated by the broken line in FIG. 2B. Specifically, the size of the top face region of the diffusion region 14 and the size of the apex face of the projection 2b are set so that the apex face of the projection 2b is included in the top face region of the diffusion region 14, as illustrated by the broken line in FIG. 2B, when the apex face of the projection 2b and the top face region of the diffusion region 14 are seen from the top face side of the bump 20 just below. The diffusion region 15 is formed in the main surface of the semiconductor substrate 10 so as to annularly surround the diffusion region 14 as illustrated in FIG. 2B. The diffusion region 15 is connected to a ground line (not illustrated) formed in the main surface of the semiconductor substrate 10.

As illustrated in the equivalent circuit of FIG. 3, specifically, the electrostatic protection circuit HCb is a diode device whose cathode terminal is connected to the bump 20 and whose anode terminal is connected to a ground line L2.

Hereinbelow, protecting operation by the electrostatic protection circuits HCa and HCb will be described.

First, when a surge voltage due to electrostatic discharge is applied to the bump 20, the surge voltage is applied to the diffusion region 12 or 14 via a path formed by the projection 2a of the bump 20, the metal pad 21, and the conductive member 24a, or a path formed by the projection 2b, the metal pad 21, and the conductive member 24b. That is, the surge voltage applied to the bump 20 is applied, as illustrated in FIG. 3, to the anode terminal of the diode device as the electrostatic protection circuit HCa or the cathode terminal of the diode device as the electrostatic protection circuit HCb. Consequently, the diode device of the electrostatic protection circuit HCa or HCb enters an on state, and a current due to the surge voltage flows in the power supply line L1 or the ground line L2 and is consumed there. Therefore, large current does not flow in a circuit network (not illustrated) constructed in the semiconductor chip 1, so that the circuit network is protected from an electrostatic discharge damage.

Figure 4:
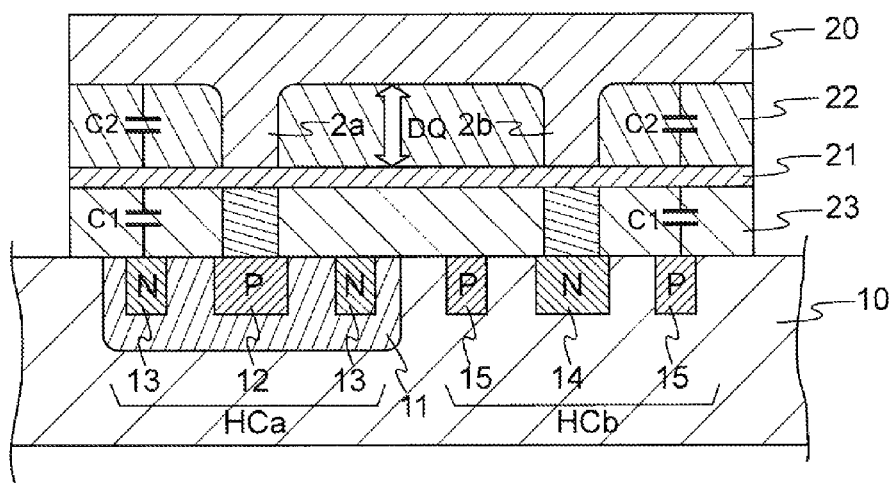
FIG. 4 is a diagram illustrating parasitic capacitances C1 and C2 formed in a further upper region than the electrostatic protection circuits HCa and HCb.

There is a case that the surge voltage applied to the bump 20 is applied not only to the anode terminal (cathode terminal) of the electrostatic protection circuit HCa (HCb) but also simultaneously to the cathode terminal (anode terminal) of the electrostatic protection circuit HCa (HCb) via parasitic capacitance by the metal pad 21, the insulating layer 23, and the power supply line L1 (ground line L2). That is, the surge voltage is applied directly to the diffusion region 12 or 14 via the projection 2a or 2b and, simultaneously, applied to the diffusion region 13 or 15 via a parasitic capacitance C1 as illustrated in FIG. 4. Since the surge voltage is applied to both ends of the diode as the electrostatic protection circuit, no current flows in the diode, and it may cause damage in the electrostatic protection circuit HCa or HCb itself.

In the semiconductor integrated device of the embodiment, by providing the undersurface of the bump 20 with the projections 2a and 2b and joining the bump 20 and the metal pad 21 via the projections 2a and 2b, the undersurface of the bump 20, except for the projections 2a and 2b, is apart from the surface of the metal pad 21 only by distance DQ, as illustrated in FIG. 4. Further, the diffusion region 12 (14) serving as the anode terminal (cathode terminal) of the diode is formed in the region just below the apex face of the projection 2a (2b), and the diffusion region 13 (15) serving as the cathode terminal (anode terminal) of the diode is formed in a region except for the region just below the projection 2a (2b). That is, the first diffusion region (12, 14) is a local region existing in a region surrounded by the second diffusion region (13, 15), and the projection (2a, 2b) which is in contact with the metal pad 21 is provided only in the region facing the first diffusion region, in the face opposed to the metal pad 21 of the conductive bump 20.

A parasitic capacitance in an upper region of each of the diffusion regions 13 and 15 is a combined capacitance in which a parasitic capacitance C2, which parasitizes between the undersurface of the bump 20 and the metal pad 21, and the parasitic capacitance C1 are in series as illustrated in FIG. 4. Therefore, the combined capacitance of the parasitic capacitances C1 and C2 is smaller than C1, so that the surge voltage applied to the diffusion region 13 (15) due to electrostatic discharge becomes lower than the surge voltage applied to the diffusion region 12 (14). That is, the potential difference occurs between both ends of the diode as the electrostatic protection circuit HCa (HCb).

Therefore, even when the surge voltage due to electrostatic discharge is applied to both ends of a diode as an electrostatic protection circuit, current flows in the diode so that damage in the internal circuit of the semiconductor chip 1 can be prevented without causing a damage in the electrostatic protection circuit itself.

Figure 5:
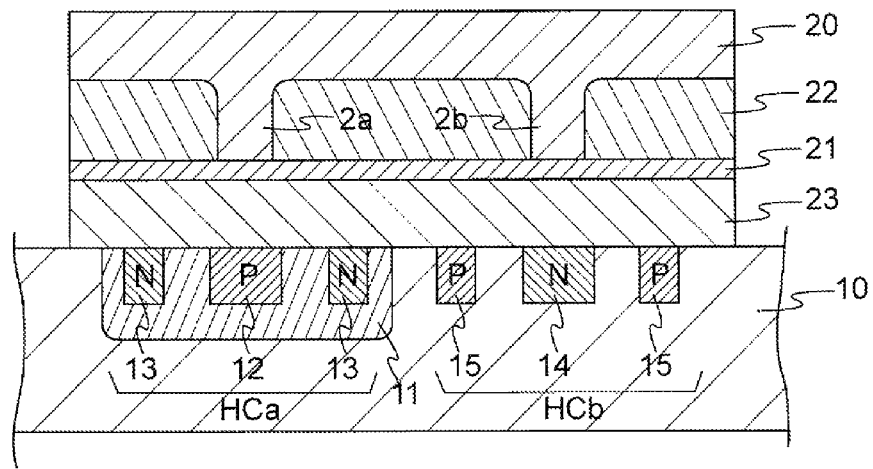
FIG. 5 is a cross section illustrating a modification of the semiconductor chip 1.

Although the conductive members 24a and 24b are provided in positions just below the projections 2a and 2b of the bump 20 as illustrated in FIG. 2A to electrically connect the metal pad 21 and the diffusion region 12 (14) in the foregoing embodiment, the present invention is not limited to the method. For example, the metal pad 21 and the diffusion regions 12 and 14 may be electrically connected by laying a metal line such as an aluminum line on the surface of the insulating layer 23 and the semiconductor substrate 10. In such case, through holes and the conductive members 24a and 24b may not exist in the insulating layer 23 as illustrated in FIG. 5.

Although the electrostatic protection circuits HCa and HCb are diodes in the above-described embodiment, they may be realized by transistors of the MOS (Metal Oxide Semiconductor) type.

Figure 6A:
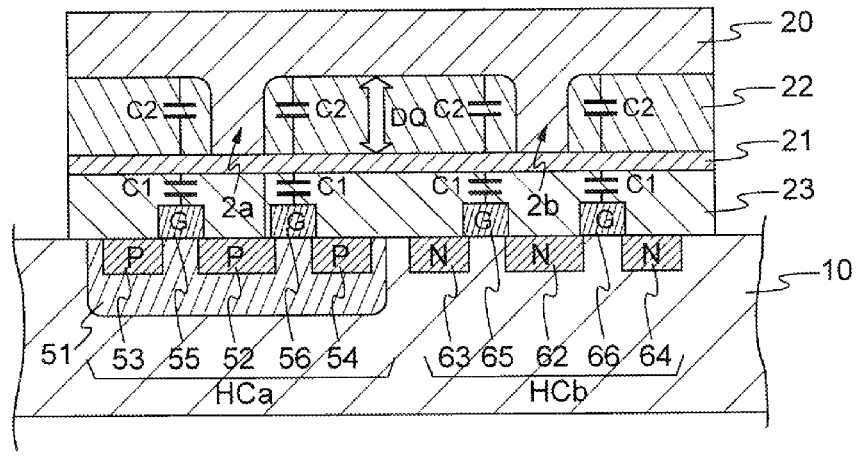
FIGS. 6A and 6B are diagrams illustrating another embodiment of the semiconductor chip 1.
Figure 6B:
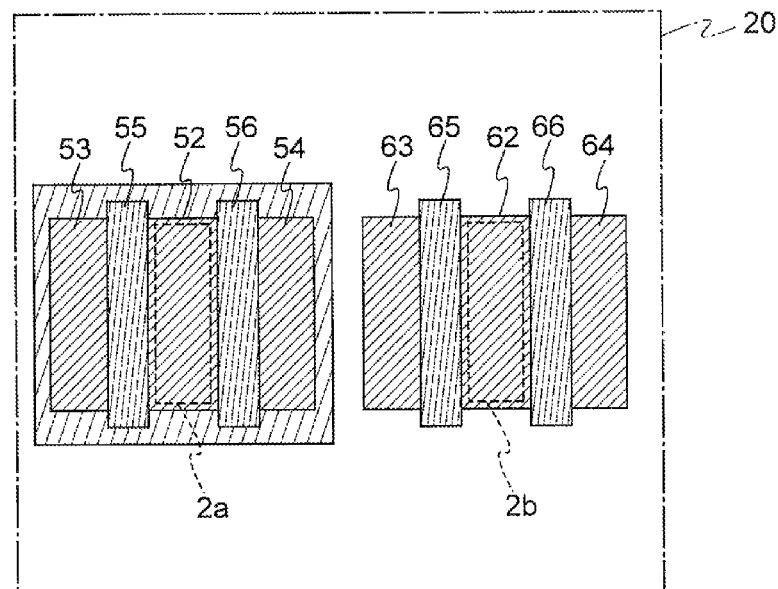

FIGS. 6A and 6B are diagrams illustrating another example of the structure of the semiconductor chip 1 achieved in view of the above point. FIG. 6A is a cross section illustrating a section of the semiconductor chip 1 taken along line W-W in FIG. 1. FIG. 6B is a top view illustrating the structure of a region corresponding to the bump 20 in the surface of the semiconductor chip 1. In FIG. 6A, the bump 20, the metal pad 21, the passivation film 22, and the insulating layer 23 are the same as those illustrated in FIG. 2A.

In FIGS. 6A and 6B, the electrostatic protection circuit HCa includes an n-well region 51 formed in the main surface of the semiconductor substrate 10 of the p-channel type, diffusion regions 52 to 54 of the p-channel type formed in the n-well region 51, and gate oxide films 55 and 56 formed on the surface of the n-well region 51. The diffusion regions 52 to 54 are formed in parallel in the main surface of the n-well region 51. The gate oxide film 55 is in contact with a part of the surface of each of the diffusion regions 52 and 53 which are adjacent each other, and the gate oxide film 56 is in contact with a part of the surface of each of the diffusion regions 52 and 54 which are adjacent to each other. In this case, the diffusion regions 53 and 54 and the gate oxide films 55 and 56 are connected to the power supply line L1, and the diffusion region 52 is connected to the metal pad 21 via a metal wire (not illustrated). Therefore, the gate oxide films 55 and 56 serve as the gate of a p-channel MOS-type transistor, the diffusion regions 53 and 54 serve as a source region, and the diffusion region 52 serves as a drain region. The diffusion region 52 as a drain region is formed in a position just below the apex face of the projection 2a of the bump 20, and the size of the top face region of the diffusion region is slightly larger than the size of the apex face of the projection 2a as illustrated by the broken line in FIG. 6B. Specifically, the size of the top face region of the diffusion region 52 and the size of the apex face of the projection 2a are set so that the apex face of the projection 2a is included in the top face region of the diffusion region 52, as illustrated by the broken line in FIG. 6B, when the apex face of the projection 2a and the top face region of the diffusion region 52 are seen from the top face side of the bump 20 just below.

Figure 7:
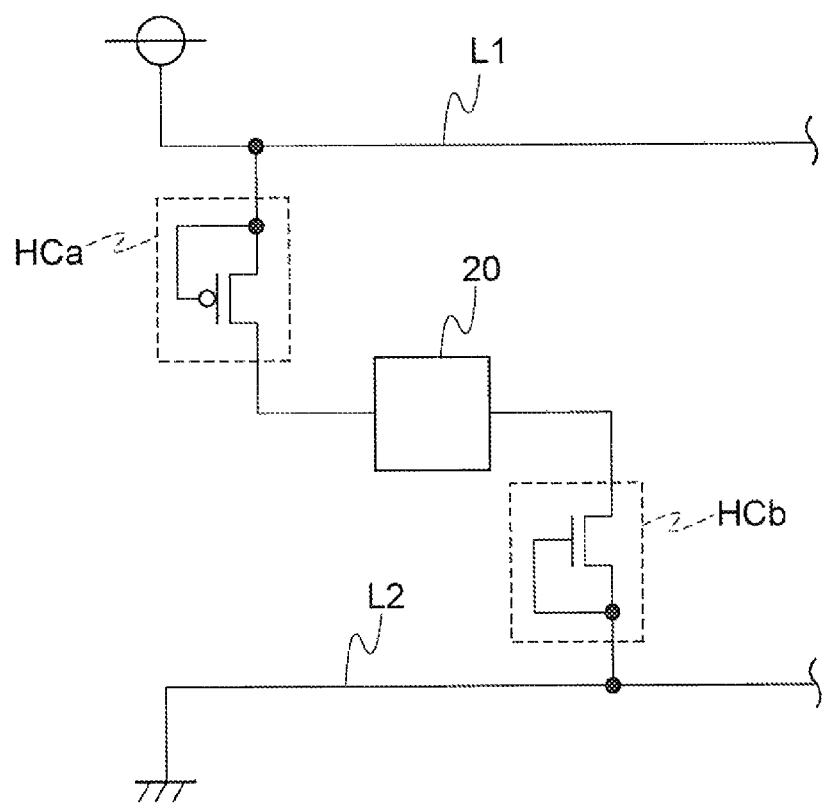
FIG. 7 is a circuit diagram illustrating an equivalent circuit of the electrostatic protection circuits HCa and HCb illustrated in FIG. 2.

As illustrated in an equivalent circuit of FIG. 7, the electrostatic protection circuit HCa is a p-channel MOS transistor whose drain terminal is connected to the bump 20 and whose gate and source terminals are connected to the power supply line L1 for supplying power supply voltage.

In FIGS. 6A and 6B, the electrostatic protection circuit HCb includes diffusion regions 62 to 64 of the n-channel type formed in the main surface of the semiconductor substrate 10 of the p-channel type, and gate oxide films 65 and 66. The diffusion regions 62 to 64 are formed in parallel in the main surface of the semiconductor substrate 10. The gate oxide film 65 is in contact with a part of the surface of each of the diffusion regions 62 and 63 which are adjacent to each other, and the gate oxide film 66 is in contact with a part of the surface of each of the diffusion regions 62 and 64, which are adjacent to each other. The diffusion regions 63 and 64 and the gate oxide films 65 and 66 are connected to the ground line L2, and the diffusion region 62 is connected to the metal pad 21 via a metal line (not illustrated). Therefore, the gate oxide films 65 and 66 serve as the gate of an n-channel MOS-type transistor, the diffusion regions 63 and 64 serve as a source region, and the diffusion region 62 serves as a drain region. The diffusion region 62 serving as a drain region is formed in a position just below the apex face of the projection 2a of the bump 20, and the size of the top face region of the diffusion region is slightly larger than the size of the apex face of the projection 2b, as illustrated by the broken line in FIG. 6B. Specifically, the size of the top face region of the diffusion region 62 and that of the apex face of the projection 2b are set so that the apex face of the projection 2a is included in the top face region of the diffusion region 62, as illustrated by the broken line in FIG. 6B, when the apex face of the projection 2b and the top face region of the diffusion region 62 are seen from the top face side of the bump 20 just below.

As illustrated in the equivalent circuit of FIG. 7, the electrostatic protection circuit HCb is an n-channel MOS transistor whose drain terminal is connected to the bump 20 and whose gate and source terminals are connected to the ground line L2.

Therefore, for the semiconductor chip 1 having the structure illustrated in FIGS. 6A and 6B, when a surge voltage due to electrostatic discharge is applied to the bump 20, the surge voltage is applied to the diffusion region 52 or 62 via the projection 2a of the bump 20 and the metal pad 21, or the projection 2b and the metal pad 21. That is, the surge voltage applied to the bump 20 is applied to the drain terminal of the p-channel MOS transistor as the electrostatic protection circuit HCa, as illustrated in FIG. 7, or to the drain terminal of the n-channel MOS transistor as the electrostatic protection circuit HCb. Consequently, the electrostatic protection circuit HCa or HCb enters an on state, and current due to the surge voltage flows in the power supply line L1 or the ground line L2 and is consumed. Therefore, large current due to the surge voltage does not flow in a circuit network (not illustrated) constructed in the semiconductor chip 1, so that the circuit network is protected from an electrostatic discharge damage.

In some cases, the surge voltage applied to the bump 20 is applied not only to the drain terminal of the electrostatic protection circuit HCa (HCb) but also simultaneously to the gate and source terminals of the electrostatic protection circuit HCa (HCb) via parasitic capacitance formed by the metal pad 21, the insulating layer 23, and the power supply line L1 (ground line L2). That is, the surge voltage may be applied to the diffusion region 52 (62) of the electrostatic protection circuit HCa (HCb) via the projection 2a (2b) and, simultaneously, applied to the gate oxide films 55 (65) and 56 (66) via the parasitic capacitance C1 as illustrated in FIG. 6A. Since the surge voltage is applied simultaneously to all of the terminals of the MOS transistor as the electrostatic protection circuit HCa (HCb) in this case, no current flows in the MOS transistor, and it may cause damage in the electrostatic protection circuit HCa (HCb) itself.

In the semiconductor chip 1 having the structure illustrated in FIGS. 6A and 6B, by joining the bump 20 and the metal pad 21 via the projections 2a and 2b provided for the undersurface of the bump 20, the undersurface of the bump 20, except for the projections 2a and 2b, is apart from the surface of the metal pad 21 only by distance DQ as illustrated in FIG. 6A. Further, the diffusion region 52 (62) serving as the drain terminal of the MOS transistor is formed in the region just below the projection 2a (2b), and the gate oxide films 55 and 56 (65 and 66) serving as the gate terminal of the MOS transistor are formed in a region except for the region just below the apex face of the projection 2a (2b).

That is, the first diffusion region (52, 62) is a local region surrounded by the second diffusion region (53, 54, 63, 64), and the projection (2a, 2b), which is in contact with the metal pad 21, is provided only in the region facing the first diffusion region, in the face opposed to the metal pad 21 of the conductive bump 20.

A parasitic capacitance in the upper region of each of the gate oxide films becomes combined capacitance in series of the parasitic capacitance C1 obtained by the metal pad 21, the insulating layer 23, and the power supply line L1 (ground line L2),and the parasitic capacitance C2 parasitizing between the undersurface of the bump 20 and the metal pad 21, as illustrated in FIG. 6A. Therefore, the combined capacitance of the parasitic capacitances C1 and C2 is smaller than C1, so that the surge voltage applied to the gate oxide film 55, 56, 65, or 66 due to electrostatic discharge becomes lower than the surge voltage applied to the diffusion region 52 or 62. The gate oxide films 55 and 56 (65 and 66) serving as the gate terminal of the MOS transistor are electrically connected to the diffusion regions 53 and 54 (63 and 64) serving as the source terminal of the MOS transistor, as illustrated in FIG. 7. Therefore, the potential difference occurs between the drain terminal and the source terminal of the MOS transistor serving as the electrostatic protection circuit HCa (HCb).

Therefore, even when the surge voltage due to electrostatic discharge is applied simultaneously to the gate terminal, the drain terminal, and the source terminal of a MOS transistor as an electrostatic protection circuit, current flows in the MOS transistor so that a damage in the internal circuit of the semiconductor chip 1 can be prevented without causing a damage in the electrostatic protection circuit itself.

As described above, the embodiment of the semiconductor integrated device includes: the semiconductor substrate 10 in which the electrostatic protection circuits HCa and HCb including the second diffusion regions (13, 15, 53, 54, 63, and 64) surrounding the first diffusion regions (12, 14, 52, and 62) as local regions are formed in the main surface; the metal pad 21 opposed to the main surface; and the conductive bump 20 opposed to the top face of the metal pad 21 and, in the face opposed to the metal pad 21 of the conductive bump 20, the projections 2a and 2b which are in contact with the metal pad 21 are provided in the range opposed to the first diffusion region.

With the structure, above the second diffusion region, the conductive bump 20 and the metal pad 21 are apart from each other. Consequently, the parasitic capacitance between the conductive bump 20 and the metal pad 21 is combined capacitance of the series connection of the first parasitic capacitance C1 between the power supply line (or ground line) and the metal pad and the second parasitic capacitance between the metal pad 21 and the conductive bump 20. Therefore, the combined capacity becomes lower than the first parasitic capacitance C1, so that the surge voltage applied to the second diffusion region decreases via the parasitic capacitance as compared with the case where there is only the first parasitic capacitance C1. It causes the potential difference between the first and second diffusion regions of the electrostatic protection circuits HCa and HCb. Consequently, even when the surge voltage is applied simultaneously to the first and second diffusion regions, the electrostatic protection circuit can consume the current due to electrostatic discharge by passing the current to the power supply line (or ground line).

Thus, according to the present invention, at the time of occurrence of an electrostatic discharge, the internal circuit of the semiconductor chip can be reliably prevented from being damaged without causing a damage in the electrostatic protection circuit itself.

Although the passivation film 22 made of an insulating film made such as an oxide film, a nitride film, and polyimide is provided between the bump 20 and the metal pad 21 in some embodiments, it is also possible not to provide the passivation film 22 to form a space between the bump 20 and the metal pad 21.

This application is based on Japanese Patent Application No. 2012-048870 which is herein incorporated by reference.

What is claimed is:

1. A semiconductor integrated device comprising:
    a semiconductor substrate having at least one electrostatic protection circuit formed in a main surface thereof;
    a metal pad confronting said main surface in its entirety via one major surface thereof; and
    a conductive bump confronting the other major surface of said metal pad,
    wherein said electrostatic protection circuit includes a first conductive region and a second conductive region which are adjacent to each other,
    said conductive bump is, in its entirety, opposed to said main surface,
    said first conductive region is surrounded by said second conductive region and, in an opposed surface, opposed to said metal pad, of said conductive bump, said conductive bump has at least one projection partially projecting toward said first conductive region so that said projection abuts said metal pad.

2. The semiconductor integrated device according to claim 1, wherein an insulating film is formed between a region excluding said projection of said opposed surface of said conductive bump and said metal pad.

3. The semiconductor integrated device according to claim 1, wherein said second conductive region is connected to a power supply line or a ground line.

4. The semiconductor integrated device according to claim 2, wherein said second conductive region is connected to a power supply line or a ground line.

5. The semiconductor integrated device according to claim 1, wherein an insulating layer is formed between said metal pad and the main surface of said semiconductor substrate, and
    a conductive member penetrating said insulating layer to electrically connect said metal pad and said first conductive region is provided.

6. The semiconductor integrated device according to claim 2, wherein an insulating layer is formed between said metal pad and the main surface of said semiconductor substrate, and
    a conductive member penetrating said insulating layer to electrically connect said metal pad and said first conductive region is provided.

7. The semiconductor integrated device according to claim 3, wherein an insulating layer is formed between said metal pad and the main surface of said semiconductor substrate, and a conductive member penetrating said insulating layer to electrically connect said metal pad and said first conductive region is provided.

8. The semiconductor integrated device according to claim 4, wherein an insulating layer is formed between said metal pad and the main surface of said semiconductor substrate, and
a conductive member penetrating said insulating layer to electrically connect said metal pad and said first conductive region is provided.

9. The semiconductor integrated device according to claim 1, wherein said electrostatic protection circuit is a transistor using said first conductive region as a drain region and said second conductive region as a source region.

10. The semiconductor integrated device according to claim 2, wherein said electrostatic protection circuit is a transistor using said first conductive region as a drain region and said second conductive region as a source region.

11. The semiconductor integrated device according to claim 3, wherein said electrostatic protection circuit is a transistor using said first conductive region as a drain region and said second conductive region as a source region.

12. The semiconductor integrated device according to claim 4, wherein said electrostatic protection circuit is a transistor using said first conductive region as a drain region and said second conductive region as a source region.

13. The semiconductor integrated device according to claim 5, wherein said electrostatic protection circuit is a transistor using said first conductive region as a drain region and said second conductive region as a source region.

14. The semiconductor integrated device according to claim 6, wherein said electrostatic protection circuit is a transistor using said first conductive region as a drain region and said second conductive region as a source region.

15. The semiconductor integrated device according to claim 7, wherein said electrostatic protection circuit is a transistor using said first conductive region as a drain region and said second conductive region as a source region.

16. The semiconductor integrated device according to claim 8, wherein said electrostatic protection circuit is a transistor using said first conductive region as a drain region and said second conductive region as a source region.

* * * * *